US012620937B2

(12) United States Patent
Yoon et al.

(10) Patent No.: US 12,620,937 B2
(45) Date of Patent: May 5, 2026

(54) AMPLIFIER CAPABLE OF CANCELING LEAKAGE COMPONENTS

(71) Applicant: SAMSUNG ELECTRONICS CO., LTD., Suwon-si (KR)

(72) Inventors: Kyunghyun Yoon, Suwon-si (KR); Jeongyeol Bae, Suwon-si (KR); Jongsoo Lee, Suwon-si (KR); Sangmin Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/216,766

(22) Filed: Jun. 30, 2023

(65) Prior Publication Data

US 2024/0120884 A1     Apr. 11, 2024

(30) Foreign Application Priority Data

Oct. 7, 2022     (KR) ........................ 10-2022-0128616
Dec. 6, 2022     (KR) ........................ 10-2022-0168966

(51) Int. Cl.
H03F 1/02          (2006.01)
H03F 3/45          (2006.01)
(52) U.S. Cl.
CPC ....... H03F 1/0205 (2013.01); H03F 3/45269 (2013.01); H03F 2200/451 (2013.01)
(58) Field of Classification Search
CPC .. H03F 1/0205; H03F 1/0277; H03F 3/45269; H03F 3/195; H03F 3/211;
(Continued)

(56) References Cited

U.S. PATENT DOCUMENTS 8,525,718 B2     9/2013   Kudou et al.
8,558,621 B2    10/2013   Kikuchi et al.
(Continued)

FOREIGN PATENT DOCUMENTS

KR        10-1334849 B1    11/2013
KR        10-1614420 B1     4/2016

OTHER PUBLICATIONS

Jang, Sunhwan et al., "A 60 GHz 2.5 Gbps OOK Modulator with Data-Dependent Impedance Cell for Enhanced On/Off Isolation in 0.18 μm BiCMOS Process", IEEE Microwave and Wireless Components Letters, vol. 25, No. 4, Apr. 10, 2015, pp. 244-246.

*Primary Examiner* — Andrea Lindgren Baltzell
*Assistant Examiner* — Nareh Shamiryan
(74) *Attorney, Agent, or Firm* — Sughrue Mion, PLLC

(57)          ABSTRACT

Disclosed is an amplifier that includes a first-first (1-1) transistor and a first-second (1-2) transistor to which differential input signals are applied to gate terminals, respectively; a second-first (2-1) transistor including: one end connected to the 1-1 transistor, a gate terminal configured to receive an operating signal, and the other end configured to output one of differential output signals; a second-second (2-2) transistor including: one end connected to the 1-2 transistor, a gate terminal configured to receive the operating signal, and the other end configured to output the other one of the differential output signals; and a switch connected to one end of the 1-1 transistor and one end of the 1-2 transistor. The switch is configured to turn on based on the 1-1 transistor, the 1-2 transistor, the 2-1 transistor, and the 2-2 transistor being turned off.

20 Claims, 9 Drawing Sheets

1000

(58) Field of Classification Search
    CPC ........ H03F 3/245; H03F 3/45188; H03F 3/72;
                    H03F 2200/451; H03G 1/0029; H03G
                                                     1/0088
    USPC .............................. 330/311, 252–261, 9, 304
    See application file for complete search history.

(56)                     References Cited

U.S. PATENT DOCUMENTS

| | | | |
|---|---|---|---|
| 8,913,976 | B2 | 12/2014 | Khatri et al. |
| 9,391,572 | B2 | 7/2016 | Staudinger |
| 2009/0212862 | A1 | 8/2009 | Kuroki |
| 2011/0304399 | A1 | 12/2011 | Kikuchi et al. |
| 2012/0242525 | A1 | 9/2012 | Kudou et al. |
| 2014/0113573 | A1 | 4/2014 | Khatri et al. |
| 2015/0357976 | A1 | 12/2015 | Staudinger |
| 2021/0067113 | A1 | 3/2021 | Chang |
| 2022/0231645 | A1 | 7/2022 | Piazzon |
| 2023/0231522 | A1* | 7/2023 | Singhal ............... H03F 3/45183 455/114.3 |

* cited by examiner

AMPLIFIER CAPABLE OF CANCELING LEAKAGE COMPONENTS

CROSS-REFERENCE TO RELATED APPLICATIONS

This application is based on and claims priority under 35 U.S.C. § 119 to Korean Patent Application No. 10-2022-0128616 filed on Oct. 7, 2022, and Korean Patent Application No. 10-2022-0168966 filed on Dec. 6, 2022, in the Korean Intellectual Property Office, the disclosures of which are incorporated by reference herein in their entireties.

BACKGROUND

1. Field

The disclosure relates to an amplifier capable of canceling leakage components.

2. Background of Related Art

Transmitters secure high-performance Dynamic Range (DR) required by various standards by adjusting gains through components included in a transmission (Tx) chain. The baseband stage included in the Tx chain has restrictions that consider a signal size to ensure the DR, a signal-to-noise ratio (SNR) to secure Error Vector Magnitude (EVM) performance, etc. Therefore, securing the DR through a gain adjustment of a radio frequency (RF) stage located after the baseband stage may be considered.

For example, it may be possible to consider securing the DR by attenuating a transmission signal through a variable gain amplifier (VGA), but for that method, a separate path for removing the influence of a driver amplifier (DA) should be implemented. Such a separate path may cause problems such as an increase in area, generation of asymmetry of a channel due to a change in load impedance, etc.

Considering the problems of securing the DR through the VGA, it may be considered to secure the DR by adjusting the gain of the DA. However, in the process of increasing the size of a transistor included in the DA to secure a gain, a problem may arise in securing the DR as leakage signals are generated.

SUMMARY

Provided are an amplifier capable of canceling leakage components and a method thereof.

According to an aspect of the disclosure, an amplifier includes a first-first (1-1) transistor and a first-second (1-2) transistor to which differential input signals are applied to gate terminals, respectively; a second-first (2-1) transistor including: one end connected to the 1-1 transistor, a gate terminal configured to receive an operating signal, and the other end configured to output one of differential output signals; a second-second (2-2) transistor including: one end connected to the 1-2 transistor, a gate terminal configured to receive the operating signal, and the other end configured to output the other one of the differential output signals; and a switch connected to one end of the 1-1 transistor and one end of the 1-2 transistor. The switch is configured to turn on based on the 1-1 transistor, the 1-2 transistor, the 2-1 transistor, and the 2-2 transistor being turned off.

According to another aspect of the disclosure, A driver amplifier includes: a plurality of unit amplifiers connected in parallel to each other through an input node and an output node and outputting differential output signals to the output node. At least one unit amplifier of the plurality of unit amplifiers includes: a 1-1 transistor and a 1-2 transistor to which differential input signals are applied to gate terminals through the input node, respectively; a 2-1 transistor including: one end connected to the 1-1 transistor, a gate terminal configured to receive an operating signal, and the other end configured to output one of differential output signals; a 2-2 transistor including: one end connected to the 1-2 transistor, the gate terminal configured to receive the operating signal, and the other end configured to output the other one of the differential output signals; and a switch connected to one end of the 1-1 transistor and one end of the 1-2 transistor. The switch is configured to turn on based on the at least one unit amplifier being turned off.

According to another aspect of the disclosure, an electronic device includes: a processor; and a Radio Frequency (RF) chip configured to: generate an RF signal based on a baseband signal received from the processor, and adjust and output a gain of the RF signal through a driver amplifier comprising a plurality of unit amplifiers. At least one unit amplifier of the plurality of unit amplifiers includes: a 1-1 transistor and a 1-2 transistor to which differential input signals are applied to gate terminals through the input node, respectively; a 2-1 transistor including: one end connected to the 1-1 transistor, a gate terminal configured to receive an operating signal, and the other end configured to output one of differential output signals; a 2-2 transistor including: one end connected to the 1-2 transistor, a gate terminal configured to receive the operating signal, and the other end configured to output the other one of the differential output signals; and a switch connected to one end of the 1-1 transistor and one end of the 1-2 transistor. The switch is configured to turn on based on the at least one unit amplifier being turned off.

BRIEF DESCRIPTION OF THE DRAWINGS

A detailed description of each drawing is provided to facilitate a more thorough understanding of the drawings referenced in the detailed description of the present disclosure.

FIG. 8 illustrates a third order intermodulation distortion (IMD3) of a driver amplifier according to whether a switch is present or not;

DETAILED DESCRIPTION

Hereinafter, embodiments of the present disclosure may be described in detail and clearly to such an extent that an ordinary one in the art easily implements the present disclosure. The embodiments described herein are example embodiments, and thus, the disclosure is not limited thereto and may be realized in various other forms. It will be understood that, although the terms first, first-first (1-1), first-second (1-2), second, second-first (2-1), second-second (2-2), third, third-first (3-1), third-second (3-2), third-third (3-3), etc. may be used herein to describe various elements, these elements should not be limited by these terms. These terms are only used to distinguish one element from another element. Thus, a first element described below could be termed a second element without departing from the teachings of the disclosure.

Figure 1:
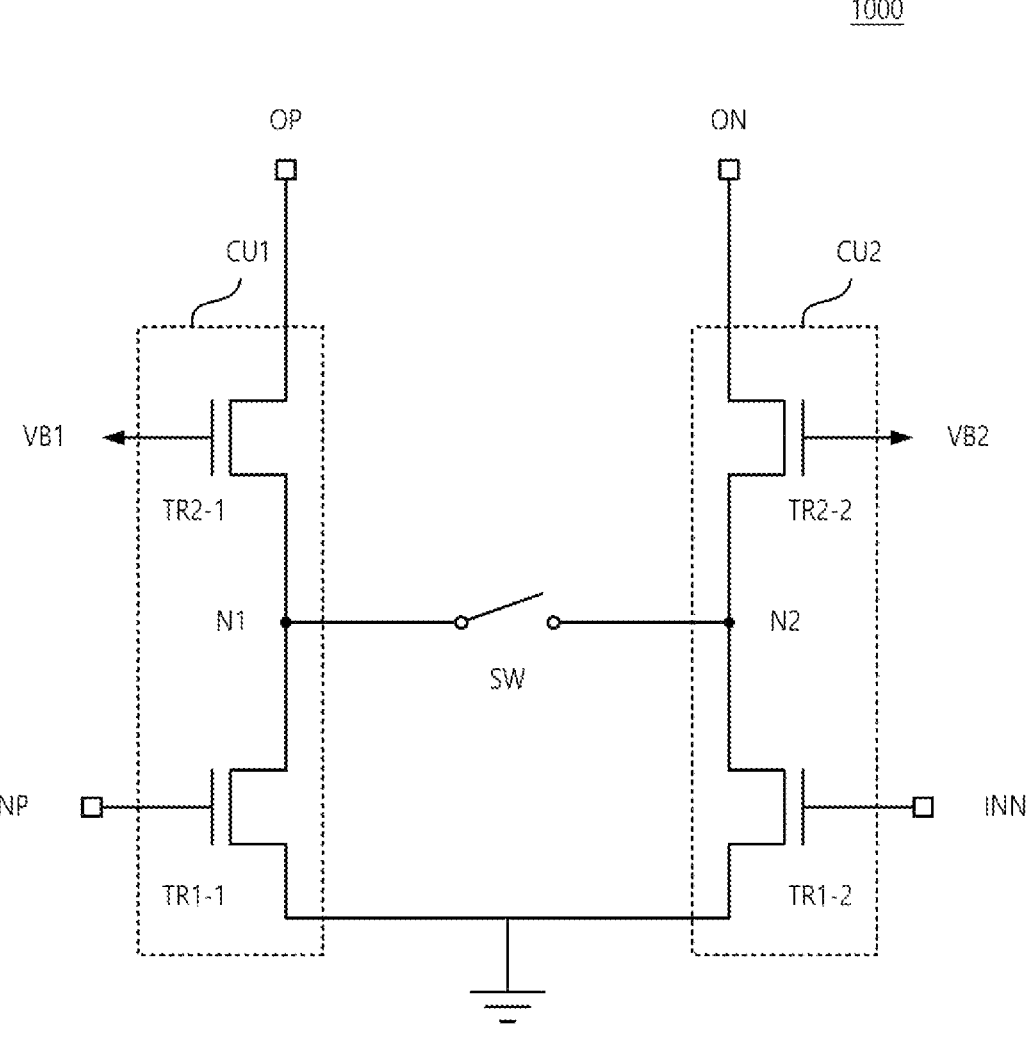
FIG. 1 illustrates an amplifier, according to an embodiment of the present disclosure.

FIG. 1 is a circuit diagram of an amplifier, according to an embodiment of the present disclosure.

Referring to FIG. 1, an amplifier 1000 according to an embodiment includes a first-first (1-1) transistor TR1-1, a first-second (1-2) transistor TR1-2, a second-first (2-1) transistor TR2-1, a second-second (2-2) transistor TR2-2, and a switch SW.

Differential input signals INP and INN may be applied to a gate terminal of the 1-1 transistor TR1-1 and a gate terminal of the 1-2 transistor TR1-2, respectively.

The differential input signals INP and INN may include a first input component INP and a second input component INN, which are differential components having phases opposite to each other. In the present disclosure, the first input component INP is applied to the gate of the 1-1 transistor TR1-1, and the second input component INN is applied to the gate of the 1-2 transistor TR1-2. However, without being limited thereto, the second input component INN may be applied to the gate of the 1-1 transistor TR1-1 and the first input component INP may be applied to the 1-2 transistor TR1-2 according to an embodiment.

As an example, the differential input signals INP and INN may be an intermediate frequency (IF) signal or a radio frequency (RF) signal, which are obtained by up-converting a baseband signal. As an embodiment, the differential input signals INP and INN may have a frequency range of an Frequency Range 1 (FR1) or an Frequency Range 2 (FR2), which are defined in New Radio (NR). The FR1 may mean "sub 6 GHz range", and the FR2 may mean "above 6 GHz range" and may be called a millimeter wave (mmW). Alternatively, the differential input signals INP and INN may be signals of various other frequency bands.

One ends of each of the 1-1 transistor TR1-1 and the 1-2 transistor TR1-2 may be commonly grounded. In detail, the 1-1 transistor TR1-1 and the 1-2 transistor TR1-2 may be common source transistors to which the differential input signals INP and INN are applied to gate terminals and the one ends are commonly grounded. In addition, the other end of the 1-1 transistor TR1-1 may be connected to one end of the 2-1 transistor TR2-1 through a first node N1, and the other end of 1-2 transistor TR1-2 may be connected to one end of the 2-2 transistor TR2-2 through a second node N2.

The one end of the 2-1 transistor TR2-1 may be connected to the 1-1 transistor TR1-1. Accordingly, the 2-1 transistor TR2-1 may be a cascode transistor stacked with the 1-1 transistor TR1-1. The 2-1 transistor TR2-1 may output one of the differential output signals OP and ON through the other end. An operating signal VB1 is applied to the gate terminal of the 2-1 transistor TR2-1, and the 2-1 transistor TR2-1 may be biased according to the operating signal VB1. That is, the 2-1 transistor TR2-1 may be a common gate transistor to which the operating signal VB1 is applied to the gate terminal and the one of the differential output signals OP and ON is output to the other end.

The 2-2 transistor TR2-2 has a stack structure in which one end is connected to the 1-2 transistor TR1-2, and thus the 2-2 transistor TR2-2 may be a cascode transistor. The 2-2 transistor TR2-2 may output the other one of the differential output signals OP and ON through the other end. An operating signal VB2 is applied to the gate terminal of the 2-2 transistor TR2-2, and as in the above description, the 2-2 transistor TR2-2 may be biased according to the operating signal VB2. That is, the 2-2 transistor TR2-2 may be a common gate transistor to which the operating signal VB2 is applied to the gate terminal and the other one of the differential output signals OP and ON is output to the other end.

A bias voltage applied to each of the gate terminals of the 1-1 transistor TR1-1, the 1-2 transistor TR1-2, the 2-1 transistor TR2-1, and the 2-2 transistor TR2-2 may be grounded when the amplifier 1000 is in the off state.

Like the differential input signals INP and INN, the differential output signals OP and ON may include the first output component OP and the second output component ON, which are differential components having phases opposite to each other. In the present disclosure, the first output component OP is output through the other end of the 2-1 transistor TR2-1, and the second output component ON is output through the other end of the 2-2 transistor TR2-2. However, without being limited thereto, the first output component OP may be output through the other end of the 2-1 transistor TR2-1, and the second output component ON may be output through the other end of the 2-2 transistor TR2-2, according to an embodiment.

In an embodiment, the 1-1 transistor TR1-1 and the 1-2 transistor TR1-2 may be designed to have threshold voltages lower than that of the 2-1 transistor TR2-1 and the 2-2 transistor TR2-2. Accordingly, operating speeds of the 1-1 transistor TR1-1 and the 1-2 transistor TR1-2 may be improved.

In an embodiment, a size of the 2-1 transistor TR2-1 may be designed to be greater than that of the 1-1 transistor TR1-1, and a size of the 2-2 transistor TR2-2 may be designed to be greater than that of the 1-2 transistor TR1-2. Accordingly, the voltage headroom of the differential output signals OP and ON of the amplifier 1000 may be secured.

However, when the sizes of the 2-1 transistor TR2-1 and the 2-2 transistor TR2-2 are relatively large, more parasitic capacitance components are generated. Accordingly, even though the amplifier 1000 is in the off state, the differential input signals INP and INN may pass through the parasitic capacitance and may reach the output terminals of the amplifier 1000, which may be defined as unnecessary leakage components from the viewpoint of the output terminals of the amplifier 1000.

Since the 1-1 transistor TR1-1 and the 2-1 transistor TR2-1 have a cascode structure, they may be referred to as a first cascode unit CU1, and since the 1-2 transistor TR1-2 and the 2-2 transistor TR2-2 also have a cascode structure, they may be referred to as a second cascode unit CU2. For example, the cascode structure is a two-stage amplifier that comprises a common-emitter stage feeding into a common-base stage.

The first cascode unit CU1 amplifies the first input component INP and outputs the first output component OP, and the second cascode unit CU2 amplifies the second input component INN and outputs the second output component ON. In an embodiment, when each of the 1-1 transistor TR1-1 and the 1-2 transistor TR1-2 is turned on (e.g., when operating in a saturation mode), the differential input signals INP and INN may be amplified, and the amplified differential input signals INP and INN may be transferred to the 2-1 transistor TR2-1 and the 2-2 transistor TR2-2, respectively. In addition, each of the first cascode unit CU1 and the second cascode unit CU2 may be turned on or turned off according to a gate voltage of each transistor included in the first cascode unit CU1 and the second cascode unit CU2.

In one embodiment, the switch SW may be connected to the one end of the 1-1 transistor and the one end of the 1-2 transistor. In an embodiment, the switch SW may be complementary to an on/off operation of the amplifier 1000. That is, the switch SW may be turned off when the amplifier 1000 is turned on and may be turned on when the amplifier 1000 is turned off. In a case that the amplifier 1000 may be turned on, the 1-1 transistor TR1-1, the 1-2 transistor TR1-2, the 2-1 transistor TR2-1, and the 2-2 transistor TR2-2 may be turned on. In another case that the amplifier 1000 may be turned off, the 1-1 transistor TR1-1, the 1-2 transistor TR1-2, the 2-1 transistor TR2-1, and the 2-2 transistor TR2-2 may be turned off.

In detail, when the amplifier 1000 may be turned on to amplify and output the differential input signals INP and INN, the 1-1 transistor TR1-1, the 1-2 transistor TR1-2, the 2-1 transistor TR2-1, and the 2-2 transistor TR2-2 may be turned on, and the switch SW may operate to be turned off. Therefore, between the one end of the 1-1 transistor TR1-1 and the one end of the 1-2 transistor TR1-2 may be in an open state, and the switch SW may not bring any effect on the amplification operation of the amplifier 1000.

In contrast, when the amplifier 1000 may be turned off, the 1-1 transistor TR1-1, the 1-2 transistor TR1-2, the 2-1 transistor TR2-1, and the 2-2 transistor TR2-2 may be turned off, and the switch SW may turn on. Accordingly, a short-circuit path may be formed between the one end of the 1-1 transistor TR1-1 and the one end of the 1-2 transistor TR1-2.

When the sizes of the 2-1 transistor TR2-1 and the 2-2 transistor TR2-2 are relatively increased, leakage components may occur as a parasitic capacitance component increases. This leakage components may be generated when the differential input signals INP and INN applied to the common source transistor pass through the common gate transistor and the parasitic capacitance component of the common gate transistor. Therefore, when the amplifier 1000 is in the off state, the leakage components exist even though an AC (Alternating Current) component should not ideally exist in the differential output signals.

According to an embodiment, the switch SW is turned on when the amplifier 1000 is turned off to form the short-circuit path, and the above-described differential input signals INP and INN do not pass to the 2-1 transistor TR2-1 and the 2-2 transistor TR2-2, which are common gate transistors, and flow through the short-circuit path. Since the first input component INP and the second input component INN included in the differential input signals INP and INN have phases opposite to each other, they may cancel each other when they meet through the short-circuit path. Therefore, since the differential input signals INP and INN cannot pass through the common gate transistor having a relatively large parasitic capacitance component, the leakage components due to the parasitic capacitance component may be removed from the differential output signals.

According to embodiments of the present disclosure, the amplifier 1000 may prevent the leakage components that may occur due to a parasitic capacitance component of a common gate transistor, by providing the switch SW that is complementary thereto when the amplifier 1000 especially is turned off, between the common source transistors. Also, since leakage components may be prevented, the DR of the amplifier 1000 may be improved.

Hereinafter, one or more embodiments of the amplifier 1000 will be described in detail.

Figure 2:
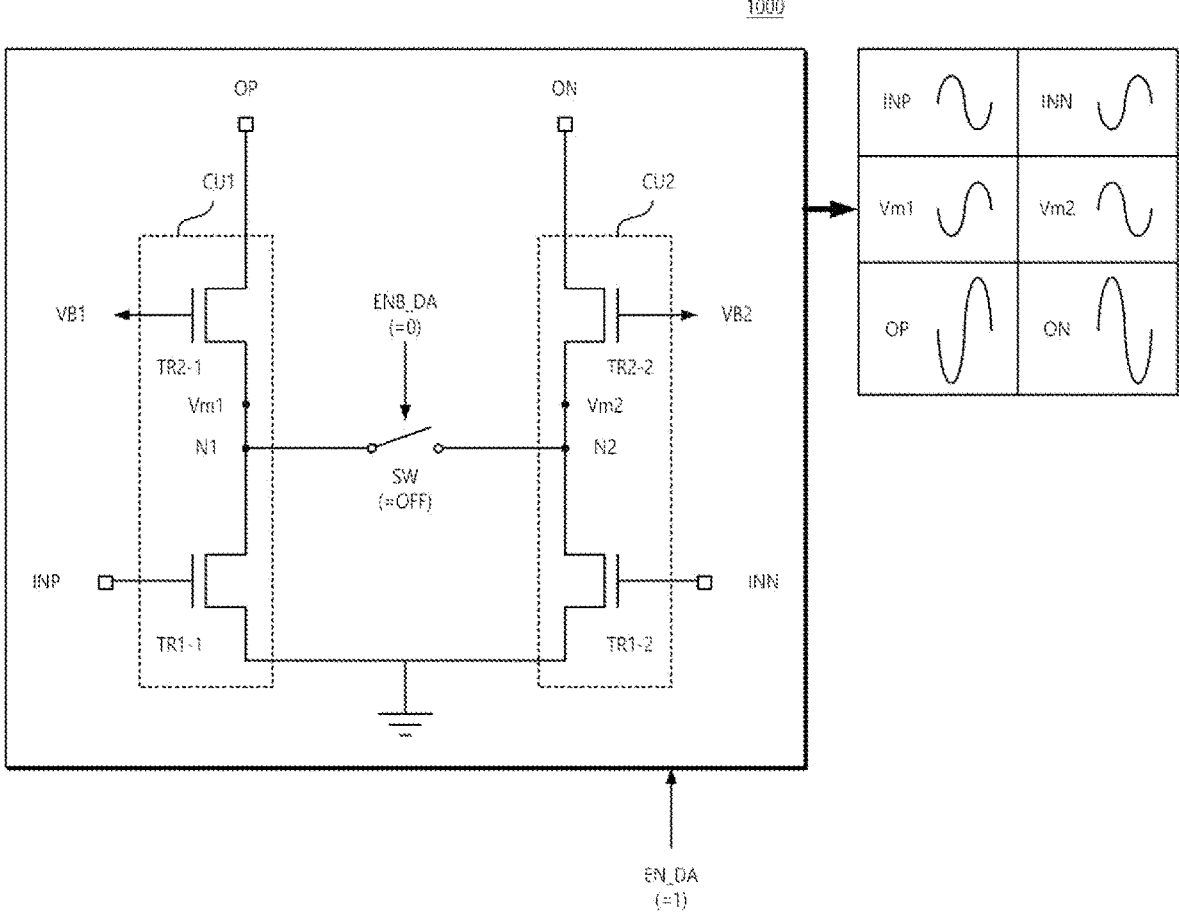
FIG. 2 illustrates an operation when an amplifier is turned on, according to an embodiment of the present disclosure.

FIG. 2 illustrates an operation when an amplifier is turned on, according to an embodiment of the present disclosure.

Referring to FIG. 2, an enable signal EN_DA for driving the amplifier 1000 may be applied to the amplifier 1000. The amplifier 1000 may be turned on or off depending on a logic state of the enable signal EN_DA. Illustratively, although the amplifier 1000 is illustrated to turn on when the logic of the enable signal EN_DA is '1' in FIG. 2, embodiments of the present disclosure are not limited thereto.

In response to the enable signal EN_DA instructing to turn on the amplifier 1000, the 1-1 transistor TR1-1, the 1-2 transistor TR1-2, the 2-1 transistor TR2-1, and the 2-2 transistor TR2-2 are turned on. According to the enable signal EN_DA, the operating signals VB1 and VB2 respectively applied to the gate terminals of the 2-1 transistor TR2-1 and the 2-2 transistor TR2-2 will have levels exceeding a threshold voltage.

A voltage Vm1 between the 2-1 transistor TR2-1 and the first node N1 may drop to a value defined based on a gain of the 1-1 transistor TR1-1 and a gain of the 2-1 transistor TR2-1. Likewise, a voltage Vm2 between the 2-2 transistor TR2-2 and the second node N2 may drop to a value defined based on a gain of the 1-2 transistor TR1-2 and a gain of the 2-2 transistor TR2-2.

The differential output signals OP and ON may be output with values obtained by amplifying the differential input signals INP and INN applied to the gate terminals of the common source transistor through the common gate transistor.

In this case, the switch SW provided between the first node N1 and the second node N2 may operate depending on a control signal ENB_DA complementary to the enable signal EN_DA. Since the enable signal EN_DA is logic '1', the control signal ENB_DA has logic '0'. Accordingly, the switch SW may be turned off, and an open-circuit path is formed between the first node N1 and the second node N2. As a result, the switch SW may not affect the amplifier 1000 when the amplifier 1000 may be turned on according to the enable signal EN_DA.

Figure 3:
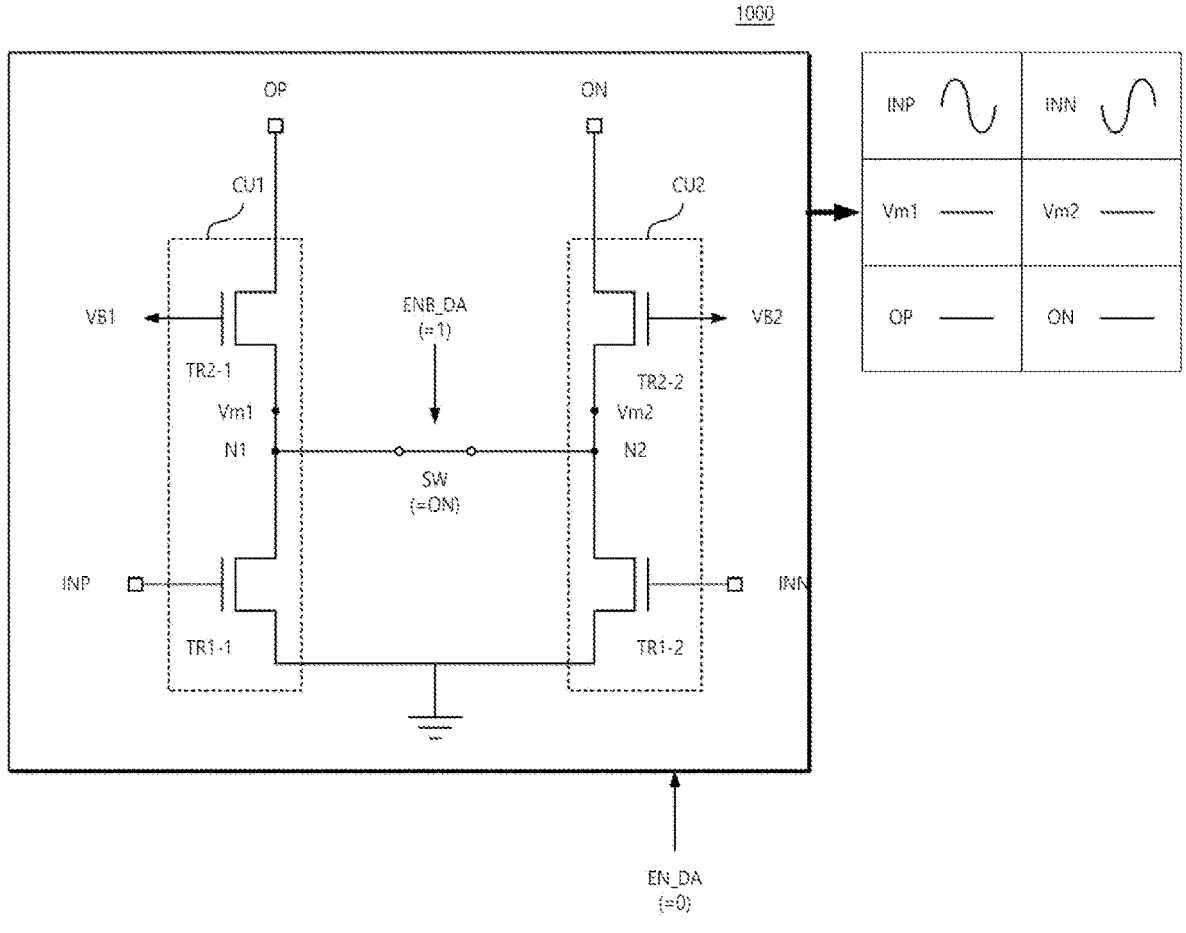
FIG. 3 illustrates an operation when an amplifier is turned off, according to an embodiment of the present disclosure.

FIG. 3 illustrates an operation when an amplifier is turned off, according to an embodiment of the present disclosure.

Referring to FIG. 3, the amplifier 1000 may be turned off when the enable signal EN_DA is logic '0'. In response to the enable signal EN_DA instructing to turn off the amplifier 1000, the 1-1 transistor TR1-1, the 1-2 transistor TR1-2, the 2-1 transistor TR2-1, and the 2-2 transistor TR2-2 are turned off. According to the enable signal EN_DA, the operating signals VB1 and VB2 will have levels less than the threshold voltage.

The control signal ENB_DA complementary to the enable signal EN_DA has logic '1'. Accordingly, the switch SW may be turned on and a short-circuit path may be formed. When the short-circuit path is formed, the differential input signals INP and INN cannot pass through the common gate transistor and move to the short-circuit path. Therefore, the first input component INP and the second input component INN, which have opposite polarities may cancel each other.

In addition, since the differential input signals INP and INN drain into the short-circuit path, swings due to leakage components do not appear in the voltages Vm1 and Vm2 and the differential output signals OP and ON.

Figure 4:
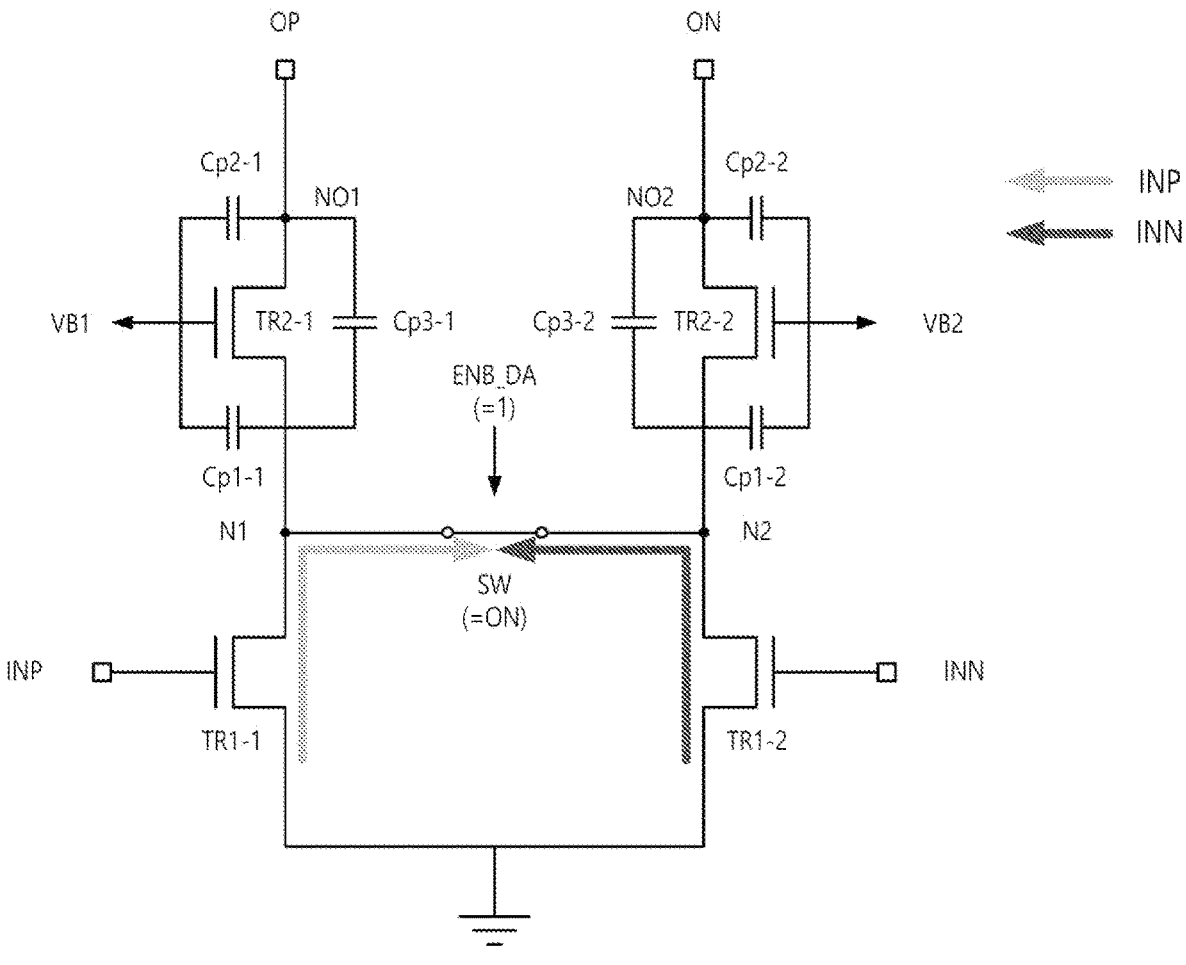
FIG. 4 illustrates a signal flow when an amplifier is turned off, according to an embodiment of the present disclosure.

FIG. 4 illustrates a signal flow when an amplifier is turned off, according to an embodiment of the present disclosure.

Referring to FIG. 4, when the amplifier 1000 is turned off, the switch SW may be turned on depending on the control signal ENB_DA, and the first input component INP and the second input component INN may cancel each other through the short-circuit path.

When the 2-1 transistor TR2-1 and the 2-2 transistor TR2-2 are implemented to be greater than the 1-1 transistor TR1-1 and the 1-2 transistor TR1-2 according to an embodiment, parasitic capacitors may exist between the gate terminal and the other end, the gate terminal and the one end, and the one end and the other end of the 2-1 transistor TR2-1 and the 2-2 transistor TR2-2.

For example, a 1-1 parasitic capacitor Cp1-1 may exist between the gate terminal of the 2-1 transistor TR2-1 and the first node N1, a 2-1 parasitic capacitor Cp2-1 may exist between the gate terminal and the first output node N01, and a 3-1 parasitic capacitor Cp3-1 may exist between the first node N1 and the first output node N01.

For example, a 1-2 parasitic capacitor Cp1-2 may exist between the gate terminal of the 2-2 transistor TR2-2 and the second node N2, a 2-2 parasitic capacitor Cp2-2 may exist between the gate terminal and the second output node NO2, and a 3-2 parasitic capacitor Cp3-2 may exist between the second node N2 and the second output node NO2.

When the short-circuit path is not formed through the switch SW, the first input component INP and the second input component INN flow into the 2-1 transistor TR2-1 and the 2-2 transistor TR2-2, and thus, leakage components due to the parasitic capacitor may occur.

According to the present disclosure, the leakage components due to the parasitic capacitors may be prevented by forming the short-circuit path through which the first input component INP and the second input component INN may cancel each other through the switch SW on the side of the common source transistor.

Figure 5:
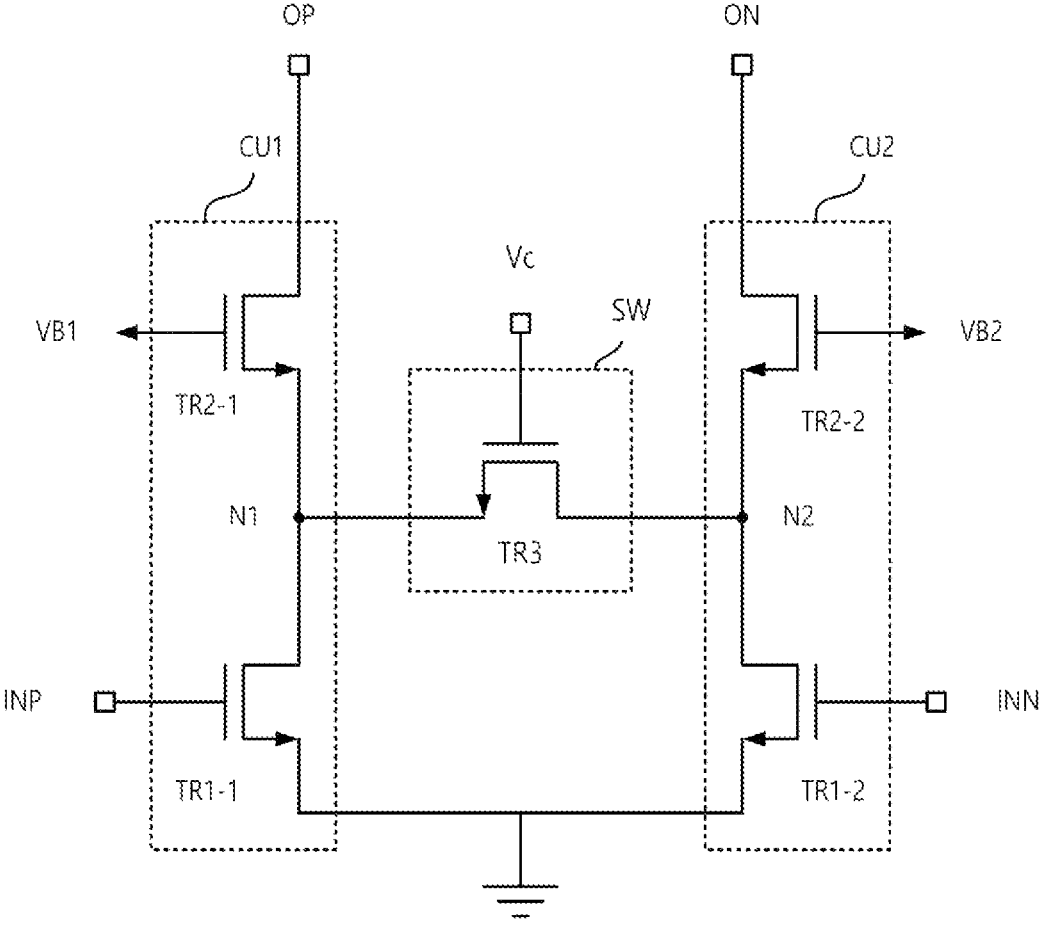
FIG. 5 illustrates an amplifier, according to another embodiment of the present disclosure.

FIG. 5 illustrates an amplifier, according to another embodiment of the present disclosure.

Referring to FIG. 5, the 1-1 transistor TR1-1, the 1-2 transistor TR1-2, the 2-1 transistor TR2-1, and the 2-2 transistor TR2-2 included in an amplifier 1000_1 as an example may be n-type metal-oxide-semiconductor field-effect transistors (NMOS FETs).

The 1-1 transistor TR1-1 may have a gate terminal to which one of the differential input signals INP and INN is applied, a source terminal connected to ground, and a drain terminal connected to a source terminal of the 1-2 transistor TR1-2. Since the drain terminal of the 1-1 transistor TR1-1 is connected to the source terminal of the 2-1 transistor TR2-1 through the first node N1, the 1-1 transistor TR1-1 and the 2-1 transistor TR2-1 may have a cascode structure.

The 1-2 transistor TR1-2 may have the gate terminal to which the other one of the differential input signals INP and INN is applied, the source terminal connected to ground, and the drain terminal connected to the source terminal of the 2-2 transistor TR2-2. Since the drain terminal of the 1-2 transistor TR1-2 is connected to the source terminal of the 2-2 transistor TR2-2 through the second node N2, the 1-2 transistor TR1-2 and the 2-2 transistor TR2-2 may have a cascode structure.

The 2-1 transistor TR2-1 may have the source terminal connected to the 1-1 transistor TR1-1, the gate terminal to which one of the operating signals VB1 and VB2 is applied, and the drain terminal connected to the first output node N01.

The 2-2 transistor TR2-2 may have the source terminal connected to the 1-2 transistor TR1-2, the gate terminal to which the other one of the operating signals VB1 and VB2 is applied, and the drain terminal connected to the second output node NO2.

Alternatively, at least one among the 1-1 transistor TR1-1, the 1-2 transistor TR1-2, the 2-1 transistor TR2-1, and the 2-2 transistor TR2-2 may be the NMOS FET, and at least one among the 1-1 transistor TR1-1, the 1-2 transistor TR1-2, the 2-1 transistor TR2-1, and the 2-2 transistor TR2-2 may be a p-type metal-oxide-semiconductor field-effect transistor (PMOS FET).

One end of the switch SW may be connected to the drain terminal of the 1-1 transistor TR1-1, and the other end of the switch SW may be connected to the drain terminal of the 1-2 transistor TR1-2. When the switch SW may be turned on as the amplifier 1000_1 is turned off, the short-circuit path is formed between the first node N1 and the second node N2, and thus the differential output signals OP and ON output from the drain terminal of the 2-1 transistor TR2-1 and the drain terminal of the 2-2 transistor TR2-2 may not include leakage components.

In an embodiment, the switch SW may be implemented based on the third transistor TR3, which is an NMOS FET. The third transistor TR3 may have a source terminal connected to the first node N1, the drain terminal connected to the second node N2, and a gate terminal to which the control signal ENB_DA having a control voltage Vc is applied.

As an example, a threshold voltage of the third transistor TR3 may be a voltage greater than threshold voltages of the 1-1 transistor TR1-1 and the 1-2 transistor TR1-2. In other words, the control voltage Vc for turning on the third transistor TR3 may also have a large value. Accordingly, the turn on/off operation may be stably performed regardless of the voltage swing applied to the first node N1 and the second node N2.

Figure 6:
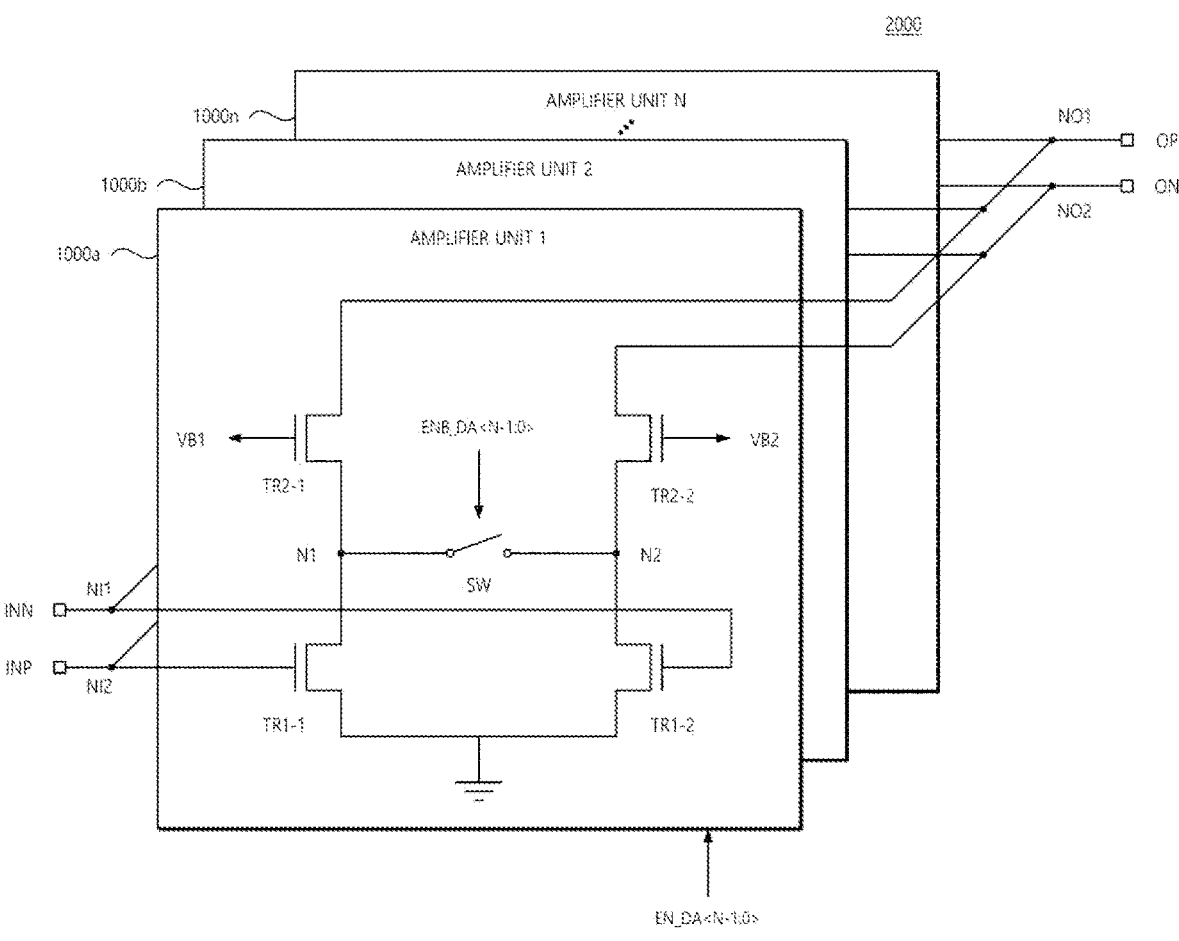
FIG. 6 illustrates a driver amplifier, according to an embodiment of the present disclosure.

FIG. 6 is a circuit diagram of a driver amplifier, according to an embodiment of the present disclosure.

Referring to FIG. 6, a driver amplifier 2000 according to an embodiment may include a plurality of unit amplifiers 1000a, 1000b to 1000n. The plurality of unit amplifiers 1000a, 1000b to 1000n may operate depending on an enabling signal EN_DA<N–1:0>. The enabling signal EN_DA<N–1:0> may correspond to the operating signals VB1 and VB2 applied to the gate terminals of the common gate transistor of each of the unit amplifiers 1000a, 1000b to 1000n. The enabling signal EN_DA<N–1:0> may include bits corresponding to 'N', which is the number of unit amplifiers 1000a, 1000b to 1000n (where 'N' is a natural number), and may be N-bits. Each of the plurality of unit amplifiers 1000a, 1000b to 1000n may be turned on or off depending on the logic state of each bit of the enabling signal EN_DA<N–1:0>.

The plurality of unit amplifiers 1000a, 1000b to 1000n may be connected to each other in parallel through input nodes (a first input node NI1 and a second input node NI2) and output nodes (a first output node N01 and a second output node NO2). Accordingly, the common differential input signals INP and INN may be applied to all of the plurality of unit amplifiers 1000a, 1000b to 1000n, and the differential output signals OP and ON may be output through the common output nodes.

Each of the plurality of unit amplifiers 1000a, 1000b to 1000n may be implemented according to the above-described embodiments. In an embodiment, one unit amplifier includes the 1-1 transistor TR1-1, the 1-2 transistor TR1-2, the 2-1 transistor TR2-1, and the 2-2 transistor TR2-2, and the switch SW.

The differential input signals INP and INN may be applied to the gate terminals of the 1-1 transistor TR1-1 and the 1-2 transistor TR1-2, respectively, through the first input node NI1 and the second input node NI2.

The other ends of the 2-1 transistor TR2-1 and the 2-2 transistor TR2-2 may be connected to the first output node NO1 and the second output node NO2, respectively, from which the amplified differential output signals OP and ON are output.

The switch SW may turn on when the plurality of unit amplifiers 1000a, 1000b to 1000n are turned off. The switch SW may operate according to the control signal ENB_DA<N−1:0> complementary to the enabling signal EN_DA<N−1:0> applied to the plurality of unit amplifiers 1000a, 1000b to 1000n. The control signal ENB_DA<N−1:0> may be N-bits like the enabling signal EN_DA<N−1:0>.

In an embodiment, the switch SW may be provided in each of the unit amplifiers 1000a, 1000b to 1000n, and may operate complementary to the operating state (on/off) of each of the unit amplifiers 1000a, 1000b to 1000n. For example, when the enabling signal (EN_DA<N−1:0>) is '0', '1', . . . , '1', the first unit amplifier 1000a may be turned off and the second unit amplifier 1000b to the N-th unit amplifier 1000n may be turned on. In this case, only the switch SW included in the first unit amplifier 1000a may be turned on. As the switch SW may be turned on, the first input component INP and the second input component INN applied to the first unit amplifier 1000a may cancel each other in the short-circuit path generated by the switch SW. Therefore, even when the differential input signals INP and INN are applied to the first unit amplifier 1000a of which operating state is in the off state, the leakage components due to the parasitic capacitance components of the 2-1 transistor TR2-1 and the 2-2 transistor TR2-2 may be prevented.

Based on whether each of the plurality of unit amplifiers 1000a, 1000b to 1000n is turned on or off, the differential output signals OP and ON of the driver amplifier 2000 may have the DR. As the number of unit amplifiers turned off increases, the minimum value of DR naturally drops. When the differential input signals INP and INN of the unit amplifier being turned off do not cancel each other out, the leakage components are generated, which may relatively increase the minimum value of the DR. However, when the leakage components are not included in the differential output signals OP and ON through the switch SW, the minimum value of the DR may be reduced.

According to the embodiments of the present disclosure, when the driver amplifier 2000 adjusts the gain by turning on or off the plurality of unit amplifiers 1000a, 1000b to 1000n, since a leakage component in the unit amplifier that is turned off may be prevented, it may be possible to have improved DR.

Figure 7:
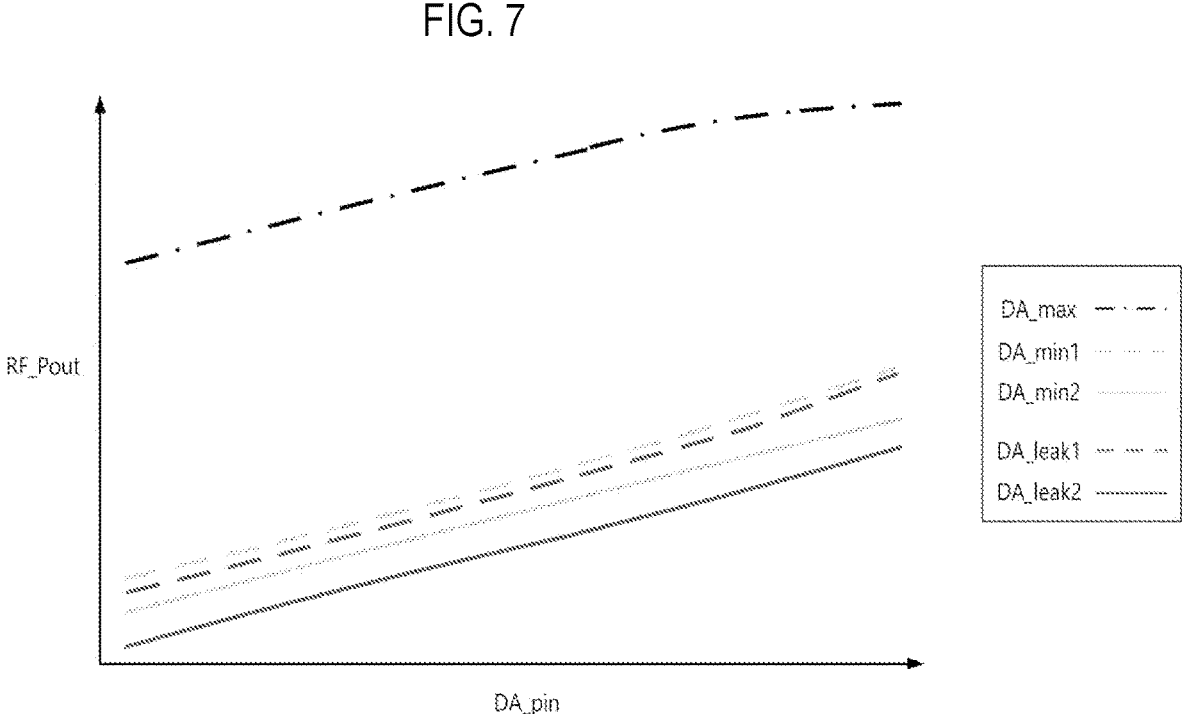
FIG. 7 illustrates output power of a driver amplifier according to whether a switch is present or not.

FIG. 7 illustrates output power of a driver amplifier according to whether a switch is present or not. A vertical axis of FIG. 7 may indicate an output power of the RF signals, which are the differential output signals OP and ON, and a horizontal axis may indicate a pin voltage applied to the driver amplifier 2000.

Referring to FIG. 7, when the amplifier operates to have the DR, a maximum value DA max of the DR hardly fluctuates. However, it may be seen that a leakage component DA_leak1 when the unit amplifier does not include the switch SW is greater than a leakage component DA_leak2 when the unit amplifier includes the switch SW. When the switch SW is present, since the leakage component DA_leak2 is reduced, it may be seen that a minimum value DA_min2 of the DR is also reduced compared to a minimum value DA_min1 of the DR when the switch SW is not present.

Figure 8:
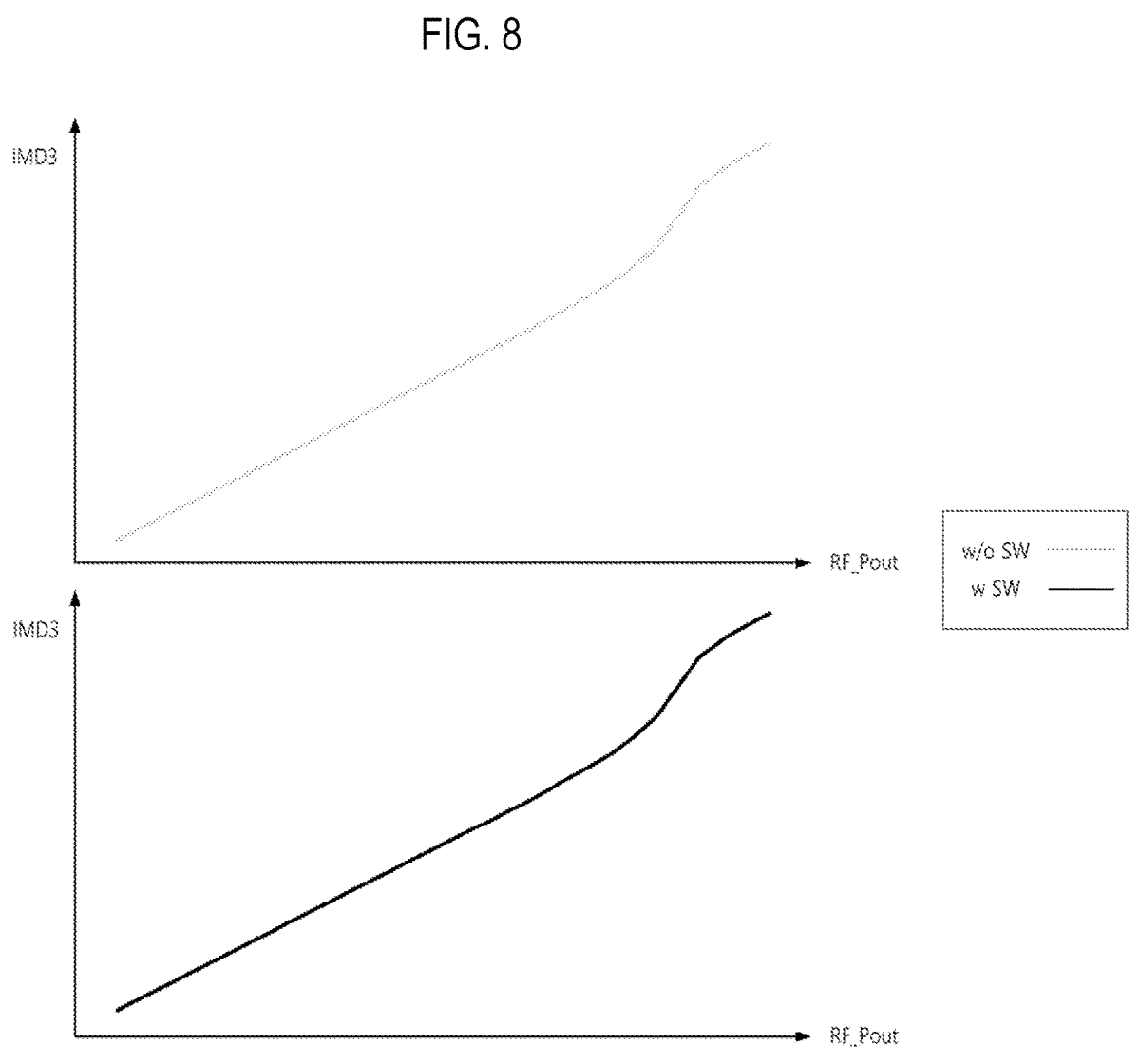

FIG. 8 illustrates an IMD3 of a driver amplifier according to whether a switch is present or not.

Referring to FIG. 8, the IMD3, which is a third order Intermodulation Distortion (IMD), represents a relative magnitude of a distortion signal to an output signal. Even if the switch SW is additionally provided in the common source transistor according to embodiments, it may be seen that the IMD3 when the switch SW is present is almost similar to the IMD3 when the switch SW is not present.

Therefore, according to embodiments of the present disclosure, leakage components may be prevented through the switch SW without deterioration of linearity.

Figure 9:
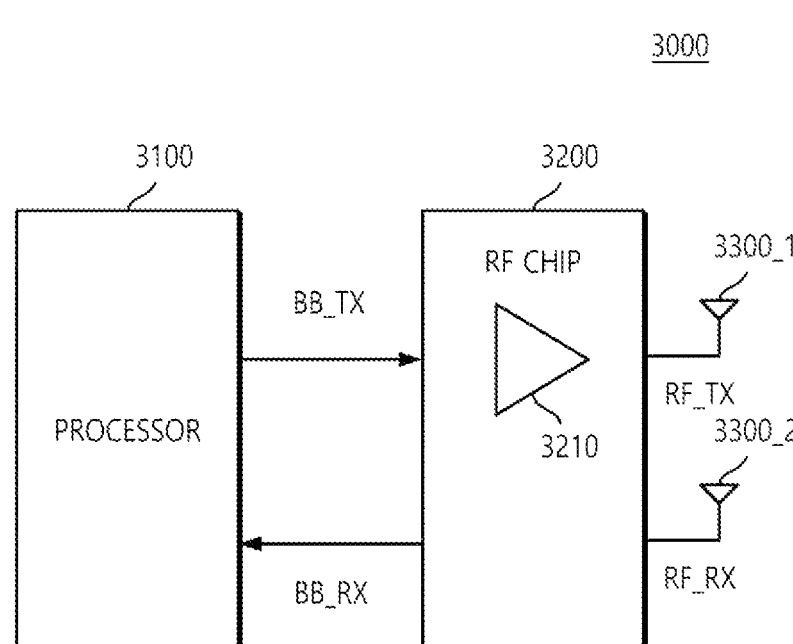
FIG. 9 illustrates an electronic device, according to an embodiment of the present disclosure.

FIG. 9 illustrates an electronic device, according to an embodiment of the present disclosure.

Referring to FIG. 9, an electronic device 3000 according to an embodiment includes a processor 3100, an RF chip 3200, and antennas 3300_1 and 3300_2.

The processor 3100 may process a digital signal and may convert the digital signal into an analog signal. Alternatively, the processor 3100 may convert and process the analog signal into the digital signal. The analog signal that is converted, or to be converted, may be a baseband signal having a baseband. The processor 3100 may transfer a baseband transmission signal BB_TX to the RF chip 3200 or may receive and process a baseband reception signal BB_RX from the RF chip 3200. The processor 3100 may be, for example, a modem, an application processor (AP), or a ModAP in which functions of a modem are integrated into an AP.

The RF chip 3200 may up-convert the baseband transmission signal BB_TX received from the processor 3100 and may output an RF transmission signal RF_TX to the antennas 3300_1 and 3300_2, or the RF chip 3200 may down-convert an RF reception signal RF_RX received from the antennas 3300_1 and 3300_2 and may output the baseband reception signal BB_RX to the processor 3100.

The RF chip 3200 may include a driver amplifier 3210 to output the RF transmission signal RF_TX corresponding to a designed gain. The gain may be set for each frequency band supported by the electronic device 3000 according to one or more embodiments. The driver amplifier 3210 may be implemented according to one or more embodiments described above.

For example, the driver amplifier 3210 may be implemented with an amplifier having a cascode structure in which a common source transistor and a common gate transistor are connected, and may include the switch SW connected to the common gate transistors included in the cascode structure. The switch SW may be included in each of a plurality of unit amplifiers included in the driver amplifier 3210. The switch SW may be turned on when the unit amplifier is turned off, thereby forming the short-circuit path through which the differential input signals INP and INN can be canceled.

For example, when the driver amplifier 3210 includes a plurality of unit amplifiers, one or more unit amplifiers among the plurality of unit amplifiers may be turned on/off according to the operating signals VB1 and VB2, and accordingly, a gain of the RF transmission signal RF_TX may be adjusted.

The antennas 3300_1 and 3300_2 may transmit the RF transmission signal RF_TX received from the RF chip 3200 to another electronic device 3000, or may transfer the RF reception signal RF_RX received from another electronic device to the RF chip 3200.

Figure 10:
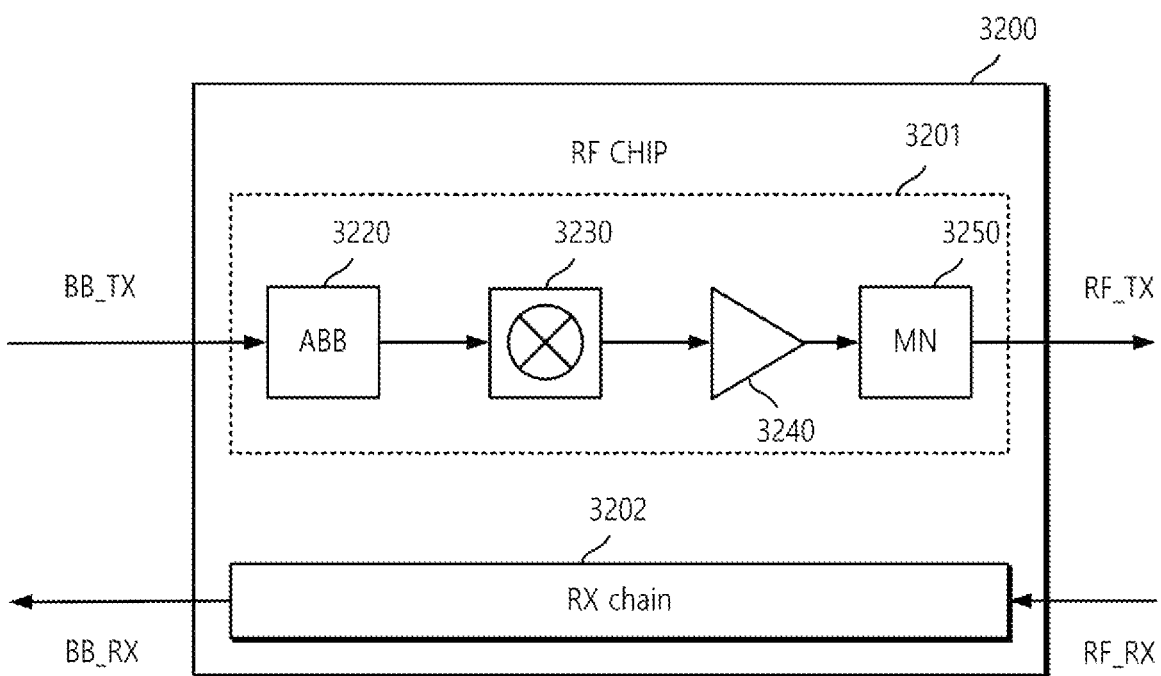
FIG. 10 illustrates an embodiment of a radio frequency (RF) chip of FIG. 9.

FIG. 10 illustrates an embodiment of an RF chip of FIG. 9.

Referring to FIG. 10, the RF chip 3200 according to an embodiment may include a transmission chain 3201 that processes the baseband transmission signal BB_TX to output the RF transmission signal RF_TX and a reception chain 3202 that processes the RF reception signal RF_RX to output the baseband reception signal BB_RX. The transmit chain 3201 may include an analog baseband (ABB) chip 3220, a mixer 3230, a driver amplifier 3240, and a matching network 3250.

The ABB chip 3220 may process the baseband transmission signal BB_TX received from the processor 3100 in baseband. For example, the ABB chip 3220 may buffer the baseband transmission signal BB_TX, may filter a signal of a specific band from the baseband signal, or may perform various other operations.

The mixer 3230 may up-convert the frequency of the signal processed through the ABB chip 3220. For example, the mixer 3230 may up-convert the frequency of the processed signal from baseband to an RF band to be transmitted.

The driver amplifier 3240 may amplify a signal up-converted to the RF band according to a designed gain. The driver amplifier 3240 may be implemented according to embodiments described above. Through the driver amplifier 3240, the RF transmission signal RF_TX may have the DR.

The matching network 3250 is connected to an output terminal of the driver amplifier 3240 and, according to one or more embodiments, may be implemented with a transformer-based network, a shunt inductor-based network, an L-network-based network, an LC tank-based network, etc. Through the matching network 3250, the differential output signals OP and ON of the driver amplifier 3240 may be converted into a single-ended signal. Output impedance of the driver amplifier 3240 may be matched through the matching network 3250.

According to an embodiment of the present disclosure, an amplifier capable of canceling leakage components may be provided through a switch operating complementary to driving of the amplifier.

The above descriptions are specific embodiments for carrying out the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An amplifier comprising:
a first-first (1-1) transistor and a first-second (1-2) transistor to which differential input signals are applied to gate terminals, respectively;
a second-first (2-1) transistor comprising:
one end connected to the 1-1 transistor,
a gate terminal configured to receive an operating signal, and the other end configured to output one of differential output signals;
a second-second (2-2) transistor comprising:
one end connected to the 1-2 transistor,
a gate terminal configured to receive the operating signal, and
the other end configured to output the other one of the differential output signals; and
a switch connected to one end of the 1-1 transistor and one end of the 1-2 transistor, and
wherein the switch is configured to turn on based on the 1-1 transistor, the 1-2 transistor, the 2-1 transistor, and the 2-2 transistor being turned off.

2. The amplifier of claim 1, wherein, based on the switch being turned on, a short-circuit path is configured to be formed between the one end of the 1-1 transistor and the one end of the 1-2 transistor.

3. The amplifier of claim 2, wherein the differential input signals comprise a first input component applied to the gate terminal of the 1-1 transistor and a second input component applied to the gate terminal of the 1-2 transistor, and
wherein, the first input component and the second input component are configured to cancel each other through the short-circuit path.

4. The amplifier of claim 3, wherein the first input component and the second input component comprise phases opposite to each other.

5. The amplifier of claim 1, wherein a size of the 2-1 transistor is greater than that of the 1-1 transistor, and
wherein a size of the 2-2 transistor is greater than that of the 1-2 transistor.

6. The amplifier of claim 1, wherein the switch is a third transistor comprising a threshold voltage greater than that of each of the 1-1 transistor and the 1-2 transistor.

7. The amplifier of claim 6, wherein a control signal applied to a gate terminal of the third transistor is complementary to the operating signal.

8. The amplifier of claim 1, wherein the 1-1 transistor, the 1-2 transistor, the 2-1 transistor, and the 2-2 transistor are n-type metal-oxide-semiconductor (NMOS) transistors, respectively.

9. The amplifier of claim 7, wherein one end of the switch is connected to a drain terminal of the 1-1 transistor, and the other end of the switch is connected to a drain terminal of the 1-2 transistor.

10. The amplifier of claim 7, wherein the differential output signals are output from a drain terminal of the 2-1 transistor and a drain terminal of the 2-2 transistor, respectively, and
wherein the differential output signals are not configured to contain a leakage component based on the switch being turned on.

11. The amplifier of claim 1, wherein the switch is configured to turn off, based on the 1-1 transistor, the 1-2 transistor, the 2-1 transistor, and the 2-2 transistor being turned on.

12. A driver amplifier comprising:
a plurality of unit amplifiers connected in parallel to each other through an input node and an output node, and configured to output differential output signals to the output node, and
wherein at least one unit amplifier of the plurality of unit amplifiers comprises:
a first-first (1-1) transistor and a first-second (1-2) transistor to which differential input signals are applied to gate terminals thereof through the input node, respectively;

a second-first (2-1) transistor comprising:
  one end connected to the 1-1 transistor,
  a gate terminal configured to receive an operating signal, and
  the other end configured to output one of the differential output signals;
a second-second (2-2) transistor comprising:
  one end connected to the 1-2 transistor,
  a gate terminal configured to receive the operating signal, and
  the other end configured to output the other one of the differential output signals; and
a switch connected to one end of the 1-1 transistor and one end of the 1-2 transistor, and
wherein the switch is configured to turn on based on the at least one unit amplifier being turned off.

13. The driver amplifier of claim 12, wherein, based on the switch being turned on, a short-circuit path is formed between the one end of the 1-1 transistor and the one end of the 1-2 transistor.

14. The driver amplifier of claim 13, wherein the differential input signals comprise a first input component applied to the gate terminal of the 1-1 transistor and a second input component applied to the gate terminal of the 1-2 transistor, and
  wherein, the first input component and the second input component cancel each other through the short-circuit path.

15. The driver amplifier of claim 12, wherein the 1-1 transistor, the 1-2 transistor, the 2-1 transistor, and the 2-2 transistor are n-type metal-oxide-semiconductor (NMOS) transistors, respectively, and
  wherein one end of the switch is connected to a drain terminal of the 1-1 transistor and the other end of the switch is connected to a drain terminal of the 1-2 transistor.

16. The driver amplifier of claim 12, wherein the differential output signals are configured not to contain a leakage component based on the switch being turned on.

17. The driver amplifier of claim 16, wherein, based on whether each of the plurality of unit amplifiers being turned on or off, the differential output signals are configured to have a dynamic range (DR), and wherein a minimum value of the DR decreases based on the leakage component being not contained in the differential output signals.

18. An electronic device comprising:
a processor; and
a radio frequency (RF) chip configured to:
  generate an RF signal based on a baseband signal received from the processor, and
  adjust and output a gain of the RF signal through a driver amplifier comprising a plurality of unit amplifiers, and
wherein at least one unit amplifier of the plurality of unit amplifiers comprises:
a first-first (1-1) transistor and a first-second (1-2) transistor to which the RF signal is applied to respective gate terminals;
a second-first (2-1) transistor comprising:
  one end connected to the 1-1 transistor,
  a gate terminal configured to receive an operating signal, and
  the other end configured to output one of differential output signals;
a second-second (2-2) transistor comprising:
  one end connected to the 1-2 transistor,
  a gate terminal configured to receive the operating signal, and
  the other end configured to output the other one of the differential output signals; and
a switch connected to one end of the 1-1 transistor and one end of the 1-2 transistor, and
wherein the switch is configured to turn on based on the at least one unit amplifier being turned off.

19. The electronic device of claim 18, wherein, based on the switch being turned on, a short-circuit path is configured to be formed between the one end of the 1-1 transistor and the one end of the 1-2 transistor.

20. The electronic device of claim 19, wherein the RF signal comprises a first input component configured to be applied to the gate terminal of the 1-1 transistor and a second input component configured to be applied to the gate terminal of the 1-2 transistor, and
  wherein, the first input component and the second input component are configured to cancel each other through the short-circuit path.

* * * * *